United States Patent
Anholt

(10) Patent No.: US 8,453,038 B2
(45) Date of Patent: May 28, 2013

(54) CHIEN SEARCH USING MULTIPLE BASIS REPRESENTATION

(75) Inventor: Micha Anholt, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 539 days.

(21) Appl. No.: 12/797,615

(22) Filed: Jun. 10, 2010

(65) Prior Publication Data

US 2010/0332955 A1 Dec. 30, 2010

Related U.S. Application Data

(60) Provisional application No. 61/221,582, filed on Jun. 30, 2009, provisional application No. 61/248,915, filed on Oct. 6, 2009.

(51) Int. Cl.
*H03M 13/00* (2006.01)

(52) U.S. Cl.
USPC ........................................ 714/781; 714/796

(58) Field of Classification Search
USPC ................ 375/262; 714/784, 782, 785, 781, 714/796
See application file for complete search history.

(56) References Cited

U.S. PATENT DOCUMENTS

| | | | |
|---|---|---|---|
| 4,845,713 A | 7/1989 | Zook | |
| 5,267,242 A | 11/1993 | Lavallee et al. | |
| 6,031,875 A * | 2/2000 | Im | 375/262 |
| 6,047,395 A | 4/2000 | Zook | |
| 6,154,869 A * | 11/2000 | Wolf | 714/784 |
| 6,353,909 B1 | 3/2002 | Amrany et al. | |
| 6,385,751 B1 | 5/2002 | Wolf | |
| 6,631,488 B1 | 10/2003 | Stambaugh et al. | |
| 6,938,196 B2 | 8/2005 | Richardson et al. | |
| 6,982,659 B2 | 1/2006 | Shen et al. | |
| 7,237,183 B2 * | 6/2007 | Xin | 714/782 |
| 7,475,103 B2 | 1/2009 | Novichkov et al. | |

(Continued)

FOREIGN PATENT DOCUMENTS

| | | |
|---|---|---|
| WO | 2007052991 A1 | 5/2007 |
| WO | 2007132453 A2 | 11/2007 |

(Continued)

OTHER PUBLICATIONS

Whiting, D.L., "Bit-Serial Reed-Solomon Decoders in VLSI", Doctor Thesis, California Institute of Technology, Aug. 22, 1984.

(Continued)

*Primary Examiner* — David Ton
(74) *Attorney, Agent, or Firm* — Meyertons, Hood, Kivlin, Kowert & Goetzel, P.C.

(57) ABSTRACT

A method for decoding an Error Correction Code (ECC) includes accepting coefficients, including at least first and second coefficients, of an Error Locator Polynomial (ELP) that is defined over a vector space and has at least one root that is indicative of a location of an error in a set of bits, which represent data that has been encoded with the ECC. The first coefficient is represented using a first basis of the vector space, and the second coefficient is represented using a second basis of the vector space, different from the first basis. Using processing circuitry, the root of the ELP is identified by applying algebraic operations to the coefficients, such that the algebraic operations are applied to the first coefficient using the first basis, and to the second coefficient using the second basis. The error is corrected responsively to the identified root of the ELP.

26 Claims, 4 Drawing Sheets

U.S. PATENT DOCUMENTS

| | | | |
|---|---|---|---|
| 7,478,310 | B2 | 1/2009 | Jung et al. |
| 7,962,839 | B1 * | 6/2011 | Wu .............................. 714/785 |
| 8,335,973 | B2 * | 12/2012 | Abe .............................. 714/782 |
| 2007/0198895 | A1 | 8/2007 | Paumier et al. |
| 2008/0172592 | A1 | 7/2008 | Wehn et al. |
| 2008/0198650 | A1 | 8/2008 | Shalvi et al. |
| 2009/0024905 | A1 | 1/2009 | Shalvi et al. |
| 2009/0070659 | A1 | 3/2009 | Zhong et al. |
| 2009/0077449 | A1 | 3/2009 | Lee |
| 2009/0094470 | A1 | 4/2009 | Gao et al. |
| 2009/0106485 | A1 | 4/2009 | Anholt |
| 2009/0187803 | A1 | 7/2009 | Anholt et al. |
| 2009/0199074 | A1 | 8/2009 | Sommer |
| 2009/0249159 | A1 | 10/2009 | Lee et al. |
| 2009/0282320 | A1 | 11/2009 | Liao et al. |
| 2010/0306626 | A1 | 12/2010 | Keays et al. |

FOREIGN PATENT DOCUMENTS

| | | |
|---|---|---|
| WO | 2007132457 A2 | 11/2007 |
| WO | 2008026203 A2 | 3/2008 |
| WO | 2008053472 A2 | 5/2008 |
| WO | 2008139441 A2 | 11/2008 |
| WO | 2009053961 A2 | 4/2009 |
| WO | 2009072103 A2 | 6/2009 |
| WO | 2009072105 A2 | 6/2009 |
| WO | 2009074979 A2 | 6/2009 |

OTHER PUBLICATIONS

U.S. Appl. No. 12/355,817 Official Action dated Dec 22, 2011.

Darabiha et al., "Power Reduction Techniques for LDPC Decoders", IEEE Journal of Solid-State Circuits, vol. 43, No. 8, pp. 1835-1845, Aug. 2008.

Chase, D., "A Class of Algorithms for Decoding Block Codes with Channel Measurement Information", IEEE Transactions on Information Theory, vol. IT-18, No. 1, pp. 170-182, Jan. 1972.

Blahut, R.E., "Theory and Practice of Error Control Codes", chapter 6, sections 6.1-6.3, pp. 130-140, Addison-Wesley Publishing Company, Inc., USA, 1983.

Blahut, R.E., "Algebraic Codes for Data Transmission", chapter 6, pp. 131-166, and chapter 7, pp. 179-190, 217-233, Cambridge University Press, UK, 2004.

Chien, R.T., "Cyclic Decoding Procedures for Bose-Chaudhuri-Hocquenghem Codes", IEEE Transactions on Information Theory, vol. IT-10, pp. 357-363, Oct. 1964.

Lin et al., "Error control coding: fundamentals and applications", chapter 6, pp. 209-215; chapter 7, pp. 241-255; chapter 17.6, pp. 871-880, 2nd edition, Pearson Education, Inc., USA, 2004.

Anholt et al., U.S. Appl. No. 12/419,304 "High-Performance ECC Decoder" filed on Apr. 7, 2009.

Gallager, R.G., "Low-Density Parity-Check Codes", Cambridge, USA, Jul. 1963.

Bez et al., "Introduction to Flash memory", Proceedings of the IEEE, vol. 91, No. 4, pp. 489-502, Apr. 2003.

Eitan et al., "Multilevel Flash Cells and their Trade-Offs", Proceedings of the 1996 IEEE International Electron Devices Meeting (IEDM), pp. 169-172, New York, USA 1996.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Maayan et al., "A 512 Mb NROM Flash Data Storage Memory with 8 Mb/s Data Rate", Proceedings of the 2002 IEEE International Solid-State circuits Conference (ISSCC 2002), pp. 100-101, San Francisco, USA, Feb. 3-7, 2002.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Gallager, R.G., "Low-Density Parity-Check Codes", IRE Transactions on Information Theory, pp. 21-28, Jan. 1962.

Wu et al., "Parallel Weighted Bit-Flipping Decoding", IEEE Communication Letters, vol. 11, No. 8, pp. 671-673, August 207, 2007.

Sharon et al., "Efficient Serial Message-Passing Schedules for LDPC Decoding", IEEE Transactions on Information Theory, vol. 53, No. 11, pp. 4076-4091, Nov. 2007.

Forney, D. G., "Generalized Minimum Distance Decoding", IEEE Transactions on Information Theory, vol. IT-12, No. 2, pp. 125-131, Apr. 1966.

Blahut, R., "Algebraic Codes for Data Transmission", Chapter 3.6, pp. 62-63, Cambridge University Press 2003.

Chen et al., "Small Area Parallel Chien Search Architectures for Long BCH Codes", IEEE Transactions on Very Large Scale Integration (VLSI) Systems, vol. 12, No. 5, pp. 656-549, May 2004.

Ha et al., "Rate-Compatible Punctured Low Density Parity Check Codes with Short Block Lengths", IEEE Transactions on Information Theory, vol. 52, No. 2, pp. 728-738, Feb. 2006.

Han et al., "An Efficient Dynamic Schedule for Layered Belief-Propagation Decoding of LDPC Codes", IEEE Communication Letters, vol. 13, No. 12, pp. 950-952, Dec. 2009.

IEEE Standard 802.11n-2009 "IEEE Standard for Information Technology—Telecommunications and Information Exchange Between Systems—Local and Metropolitan Area Networks—Specific Requirements Part 11: Wireless LAN Medium Access Control (MAAC) and Physical Layer (PHY) Specifications", Oct. 29, 2009.

Kim et al., "Design of Rate-Compatible Irregular LDPC Codes for Incremental Redundancy Hybrid ARQ Schemes", IEEE International Symposium on Information Theory (ISIT), pp. 1139-1143, Seattle, USA, Jul. 2006.

Kou et al., "Low Density Parity Check Codes Based on Finite Geometries: A Rediscovery and New Results", IEEE Transactions on Information Theory, vol. 47, No. 7, pp. 2711-2736, Nov. 2001.

Li et al., "Rate-Compatible Low Density Parity Check Codes for Capacity-Approaching ARQ Schemes in Packet Data Communications", Proceedings of the International Conference on Communications, Internet and Information Technology (CIIT), U.S. Virgin Islands, Nov. 2002.

Yazdani et al., "On Construction of Rate-Compatible Low-Density Parity-Check Codes", IEEE Communication Letters, vol. 8, No. 3, pp. 159-161, Mar. 2004.

U.S. Appl. No. 12/843,029 "Efficient LDPC codes", filed on Jul. 25, 2010.

U.S. Appl. No. 12/728,289 "Dual ECC decoder", filed on Mar. 22, 2010.

* cited by examiner

CHIEN SEARCH USING MULTIPLE BASIS REPRESENTATION

CROSS-REFERENCE TO RELATED APPLICATIONS

This application claims the benefit of U.S. Provisional Patent Application 61/221,582, filed Jun. 30, 2009, and U.S. Provisional Patent Application 61/248,915, filed Oct. 6, 2009, whose disclosures are incorporated herein by reference.

FIELD OF THE INVENTION

The present invention relates generally to Error Correction Coding (ECC), and particularly to methods and systems for high-performance ECC decoding.

BACKGROUND OF THE INVENTION

Error Correction Codes (ECC) are used in a variety of applications, such as in various digital communication and data storage applications. Some ECC decoders apply a multistage process, which decodes ECC code words by calculating syndromes of the code words, using the syndromes to generate Error Locator Polynomials (ELPs) whose roots indicate the error locations in the code words, finding the ELP roots, and thus correcting the errors. Some ECC types that are commonly decoded using such a process comprise, for example, Bose-Chaudhuri-Hocquenghem (BCH) codes and Reed-Solomon (RS) codes.

Various schemes for generating ELPs from syndromes are known in the art. Some well-known schemes comprise, for example, the Berlekamp-Massey algorithm, the Euclidean algorithm and the Peterson Gorenstein Zierler algorithm. Examples of methods for determining ELPs are described, for example, by Lin and Costello in "Error Control Coding Fundamentals," Prentice Hall, second edition, 2004, chapter 6, pages 209-215, and chapter 7, pages 241-255; and by Blahut in "Algebraic Codes for Data Transmission," Cambridge University Press, 2004, chapter 6, pages 131-166, and chapter 7, pages 179-190 and 217-223, which are incorporated herein by reference.

A method for finding ELP roots is described by Chien in "Cyclic Decoding Procedure for the Bose-Chaudhuri-Hocquenghem Codes," IEEE Transactions on Information Theory, vol. IT-10, October, 1964, pages 357-363, which is incorporated herein by reference. This method is commonly known as the "Chien search." Chen and Parhi describe hardware configurations that perform parallel Chien search, in "Small Area Parallel Chien Search Architectures for Long BCH Codes," IEEE Transactions on Very Large Scale Integration (VLSI) Systems, Vol. 12, No. 5, May 2004, pages 545-549, which is incorporated herein by reference.

SUMMARY OF THE INVENTION

An embodiment of the present invention that is described herein provides a method for decoding an Error Correction Code (ECC), the method including:

accepting coefficients, including at least first and second coefficients, of an Error Locator Polynomial (ELP) that is defined over a vector space and has at least one root that is indicative of a location of an error in a set of bits, which represent data that has been encoded with the ECC;

representing the first coefficient using a first basis of the vector space, and representing the second coefficient using a second basis of the vector space, different from the first basis;

using processing circuitry, identifying the root of the ELP by applying algebraic operations to the coefficients, such that the algebraic operations are applied to the first coefficient using the first basis, and to the second coefficient using the second basis; and correcting the error responsively to the identified root of the ELP.

In some embodiments, representing the coefficients includes selecting the first and second bases such that the algebraic operations applied to the coefficients include sparse matrix multiplications. In an embodiment, the first basis includes first vectors, each first vector including a respective power of a first matrix multiplied by a first vector, and the second basis includes second vectors, each second vector including a respective power of a second matrix multiplied by a second vector, such that the first matrix is different from the second matrix. In a disclosed embodiment, applying the algebraic operations to the coefficients includes multiplying the first and second coefficients by first and second multiplicands, respectively, and the first matrix depends on the first multiplicand and the second matrix depends on the second multiplicand.

In another embodiment, identifying the root includes converting results of the algebraic operations applied to the coefficients to a common algebraic basis, combining the results at the common algebraic basis, and determining the root responsively to the combined results. In yet another embodiment, applying the algebraic operations to the coefficients includes multiplying the first and second coefficients by first and second multiplicands respectively using first and second multipliers, each including a cascade of bit registers with weighted feedback taps. In a disclosed embodiment, the method includes receiving a communication signal that carries the data encoded with the ECC, extracting the bits from the signal, and calculating the coefficients based on the extracted bits. In an alternative embodiment, the method includes retrieving the data encoded with the ECC from a memory, and calculating the coefficients based on the retrieved bits.

There is additionally provided, in accordance with an embodiment of the present invention, a method for decoding an Error Correction Code (ECC), the method including:

accepting coefficients of an Error Locator Polynomial (ELP), which is defined over a field and has at least one root that is indicative of a location of an error in a set of bits, which represent data that has been encoded with the ECC;

selecting one of first and second predefined operational modes for identifying the root of the ELP, such that in the first operational mode the root is identified by evaluating the ELP on a single element of the field using a first bank of registers, each holding one of the coefficients, and a second bank of multipliers that are coupled respectively to the registers, and in the second operational mode the root is identified by evaluating the ELP on two or more elements of the field concurrently using the first bank of the registers and the second bank of the multipliers; and identifying the root of the ELP using the selected operational mode, and correcting the error responsively to the identified root.

In some embodiments, upon selecting the second operational mode, identifying the root includes splitting the registers and the multipliers into two or more subsets, and evaluating the ELP on each of the two or more elements of the field using a respective subset of the registers and the multipliers. Alternatively, upon selecting the second operational mode, identifying the root includes defining a product polynomial, which includes the ELP applied to an operand, multiplied by the ELP applied to a multiple of the operand, and finding one or more roots of the product polynomial. In an embodiment, the method includes receiving a communication signal that carries the data encoded with the ECC, extracting the bits from the signal, and calculating the coefficients based on the extracted bits. In another embodiment, the method includes retrieving the data encoded with the ECC from a memory, and calculating the coefficients based on the retrieved bits.

There is further provided, in accordance with an embodiment of the present invention, apparatus for decoding an Error Correction Code (ECC), the apparatus including:

basis conversion circuitry, which is configured to accept coefficients, including at least first and second coefficients, of an Error Locator Polynomial (ELP) that is defined over a vector space and has at least one root that is indicative of a location of an error in a set of bits, which represent data that has been encoded with the ECC, to represent the first coefficient using a first basis of the vector space, and to represent the second coefficient using a second basis of the vector space, different from the first basis; and root search circuitry, which is configured to identify the root of the ELP by applying algebraic operations to the coefficients, such that the algebraic operations are applied to the first coefficient using the first basis and to the second coefficient using the second basis.

There is also provided, in accordance with an embodiment of the present invention, apparatus for decoding an Error Correction Code (ECC), the apparatus including:

Error Locator Polynomial (ELP) computation circuitry, which is configured to calculate coefficients of an ELP, which is defined over a field and has at least one root that is indicative of a location of an error in a set of bits, which represent data that has been encoded with the ECC; and root search circuitry, which includes a first bank of registers, each holding one of the coefficients, and a second bank of multipliers that are coupled respectively to the registers, and which is configured to select one of first and second predefined operational modes for identifying the root of the ELP, such that in the first operational mode the root is identified by evaluating the ELP on a single element of the field using the first bank of the registers and the second bank of the multipliers, and in the second operational mode the root is identified by evaluating the ELP on two or more elements of the field concurrently using the first bank of the registers and the second bank of the multipliers, and to identify the root of the ELP using the selected operational mode.

The present invention will be more fully understood from the following detailed description of the embodiments thereof, taken together with the drawings in which:

DETAILED DESCRIPTION OF EMBODIMENTS

Overview

Power consumption and hardware size are prime considerations in many ECC decoding applications. For example, ECC decoders are commonly used in small and low-cost communication, computing and storage devices, which operate on battery power. In these sorts of devices, it is important to minimize the power consumption and the physical size of the ECC decoder, in order to reduce the battery drain, physical size and cost of the device.

Some ECC decoders accept input code words that may contain errors, and operate on each input code word to produce multiple syndromes of the code word. Using the syndromes, such an ECC decoder generates an Error Locator Polynomial (ELP) whose roots are indicative of locations of errors in the code word. The ECC decoder then finds the ELP roots, and corrects the errors indicated by the roots.

Embodiments of the present invention provide improved methods and apparatus for ECC decoding, which reduce the hardware size and power consumption of the circuitry that identifies the ELP roots. These techniques are suitable for various kinds of ECC that use syndromes and ELPs, such as Bose-Chaudhuri-Hocquenghem (BCH) codes and Reed-Solomon (RS) codes.

Typically, the ELP is defined over a Galois Field (GF), and the ECC decoder finds the ELP roots by evaluating the ELP on different field elements. In some embodiments, the ECC decoder evaluates the ELP by operating a set of multipliers, each of which operates on a respective ELP coefficient. The multiplication operation performed by a given multiplier on a given ELP coefficient can be represented as a multiplication of a matrix by a vector in a certain vector space. In some embodiments, the ECC decoder represents different ELP coefficients using different algebraic bases of the vector space. (More generally, at least two of the ELP coefficients are represented using bases that differ from one another.) As such, the algebraic operations (e.g., multiplication) associated with each ELP coefficient are performed using the respective basis in which the coefficient is represented. Each basis is selected such that the multiplied matrix is sparse, i.e., has only a small number of non-zero elements. As a result, the algebraic operations can be implemented using smaller-size hardware that consumes less power.

In some embodiments, the ECC decoder evaluates the ELP on two or more field elements concurrently using a single bank of registers (that hold the coefficients) and a single bank of multipliers that are coupled to the respective registers. These techniques increase the speed of the error location process with little or no increase in hardware size and power consumption. These configurations are particularly suitable for cases in which the expected number of errors per code word is relatively small.

Several efficient hardware configurations that implement the disclosed techniques are described and discussed hereinbelow.

System Description

Figure 1:
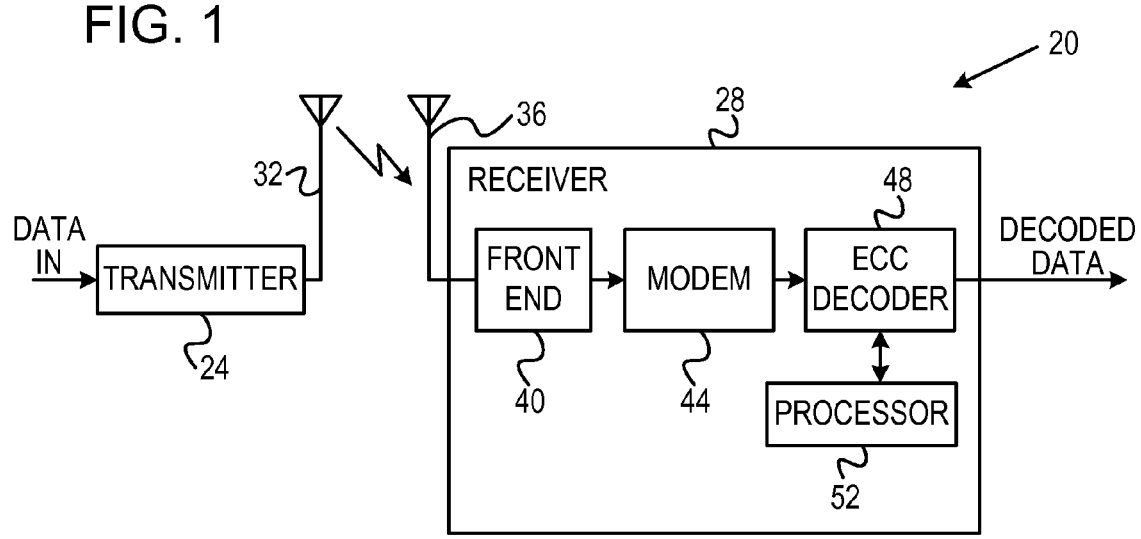
FIG. 1 is a block diagram that schematically illustrates a communication system that employs Error Correction Coding (ECC), in accordance with an embodiment of the present invention.

FIG. 1 is a block diagram that schematically illustrates a wireless communication system 20 that employs error correction coding, in accordance with an embodiment of the present invention. System 20 comprises a transmitter 24, which transmits data to a receiver 28. The transmitter accepts input data, encodes the data with a certain ECC, modulates the encoded data in accordance with a certain modulation scheme, converts the modulated digital signal to an analog signal, up-converts the analog signal to a suitable Radio frequency (RF), and transmits the RF signal toward the receiver using a transmit antenna 32.

In receiver 28, a receive antenna 36 receives the RF signal and provides it to a RF front end 40. The front end down-converts the RF signal to baseband or to a suitable Intermediate Frequency (IF), and digitizes the signal with a suitable Analog to Digital Converter (ADC—not shown in the figure). The digitized signal carrying the ECC-encoded data is demodulated by a modem 44, and the ECC is decoded by an ECC decoder 48. Decoder 48 is controlled by a processor 52. The structure and functionality of decoder 48 are described in detail below. By decoding the ECC, decoder 48 reconstructs the data that was input to transmitter 24. The reconstructed data is provided as the receiver output.

System 20 may comprise, for example, a cellular system, a satellite system, a point-to-point communication link, or any other suitable communication system that employs ECC. Although the example of FIG. 1 refers to a wireless communication system, the techniques described herein can be used with wire-line communication systems, such as cable communication systems, as well.

Figure 2:
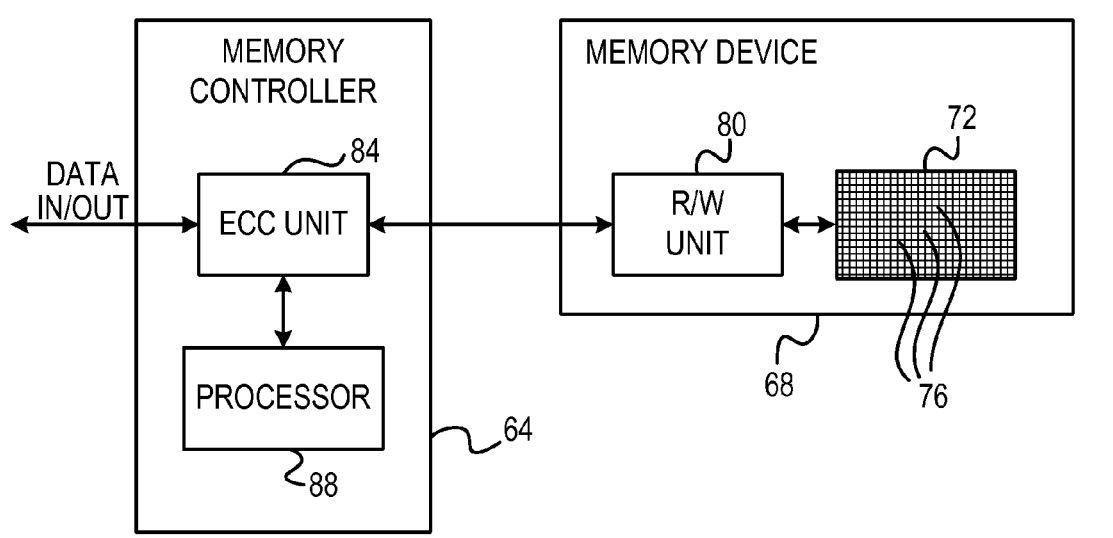
FIG. 2 is a block diagram that schematically illustrates a data storage system that employs ECC, in accordance with an embodiment of the present invention.

FIG. 2 is a block diagram that schematically illustrates a data storage system 60 that employs error correction coding, in accordance with an alternative embodiment of the present invention. System 60 comprises a memory controller 64, which stores data in a memory device 68. The memory device comprises an array 72 comprising multiple memory cells 76. Array 72 may comprise any suitable type of volatile or non-volatile memory, such as, for example, Random Access Memory (RAM) or Flash memory. Alternatively, device 68 may comprise a magnetic storage device such as a Hard Disk Drive (HDD), or any other suitable storage medium. System 60 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

Memory device 68 comprises a Read/Write (R/W) unit 80, which writes data values into memory cells 76 and reads data values from the memory cells. Memory controller 64 comprises an ECC unit 84, which encodes the data for storage with a certain ECC, and decodes the ECC of data that is retrieved from the memory cells. Unit 84 is controlled by a processor 88. The structure and functionality of unit 84 are described in detail below. The ECC used in systems 20 and 60 may comprise, for example, a suitable BCH or RS code, as well as various other types of ECC.

The ECC decoding schemes described herein can be used in communication systems such as system 20, as well as in data storage systems such as system 60. The description that follows applies to both communication applications and to storage applications, and refers generally to an ECC decoder. Any reference to the ECC decoder applies to decoder 48 of system 20, as well as to the decoder functionality of unit 84 in system 60. Alternatively, the methods described herein can be carried out by any other suitable element in any other suitable system that involves ECC decoding.

Figure 3:
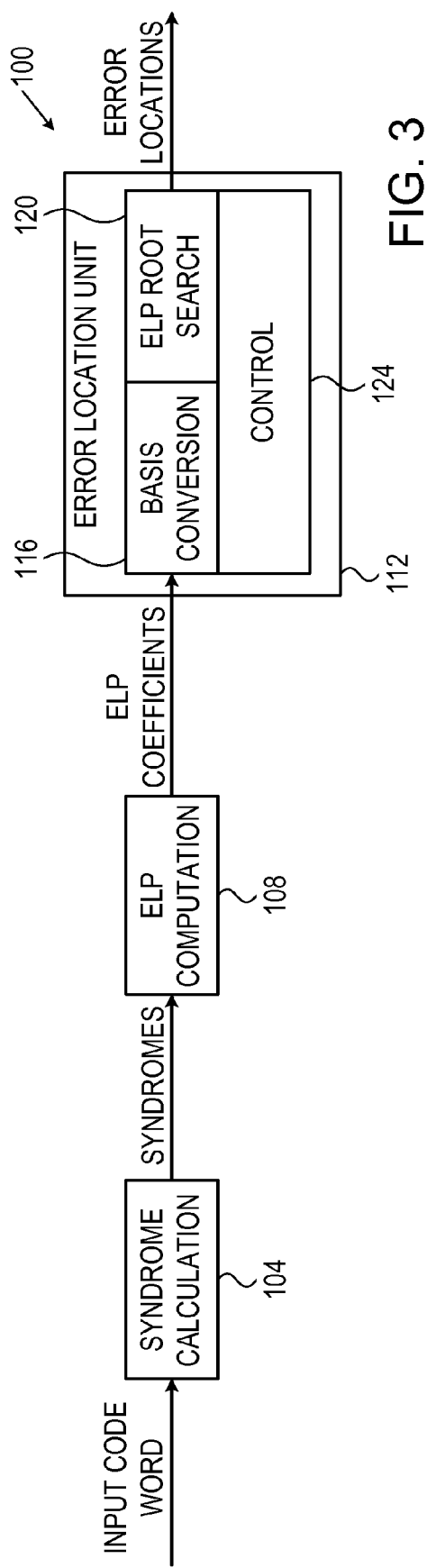
FIG. 3 is a block diagram that schematically illustrates an ECC decoder, in accordance with an embodiment of the present invention.

FIG. 3 is a block diagram that schematically illustrates an ECC decoder 100, in accordance with an embodiment of the present invention. Decoder 100 can be used to implement decoder 48 of FIG. 1 above, or ECC unit 84 of FIG. 2 above. Decoder 100 accepts ECC code words, which may contain errors. In other words, the input code words may not always comprise valid code words of the ECC. The ECC decoder decodes the input code words while attempting to correct these errors, so as to reconstruct the data conveyed in the code words. In a typical implementation, each code word comprises on the order of several hundred to several thousand bits, although any other suitable code word size can be used.

Decoder 100 comprises a syndrome calculation unit 104, which calculates a syndrome for each input code word. The syndrome is typically defined as Hy=S, wherein H denotes the parity check matrix of the ECC, y denotes an input code word and S denotes a vector of syndromes of code word y, denoted $S_1, S_2, S_3 \ldots$. When input code word y contains no errors, i.e., when y is a valid code word, Hy=0.

When the ECC is defined over a certain finite Galois Field (GF) having a primitive field element (also referred to as a field-generating element) $\alpha$, the $k^{th}$ syndrome $S_k$ can typically be written as $$S_k = \sum_{i=0}^{n-1} b_i \alpha^{ki}$$

(or as $$S_k = \sum_{i=0}^{n-1} b_i \alpha^{n-1-ki}$$

if the bit order is reversed), wherein $b_i$ denote the bits of the input code word. For a BCH code, coefficients $b_i$ are elements of the field GF(p), and each syndrome $S_k$ is an element of the field GF($p^m$). For a Reed-Solomon code, both coefficients $b_i$ and the syndromes $S_k$ are elements of the field GF($p^m$). The description that follows refers mainly to codes defined over GF($2^m$), although the methods and systems described herein are applicable to codes defined over any other suitable field. In a typical implementation, m=4 ($2^m$=16), although any other suitable value of m can also be used. Unit 94 typically computes and outputs a set of syndromes for each input code word.

(The description given herein refers mainly to BCH and RS codes, although it is applicable to various other codes that are defined by multiples of a given polynomial. In general, the syndromes are produced by applying the roots of this polynomial to the received code word.)

The syndromes output by unit 104 are processed by an Error Locator Polynomial (ELP) computation unit 108. For a given set of syndromes corresponding to a given code word, unit 108 determines an ELP defined over GF($2^m$) whose roots are indicative of the error locations in the given code word. The ELP can be written as ELP(x)=1+$a_1$x+$a_2$x$^2$+ . . . +$a_j$x$^j$, wherein j denotes the rank of the ELP, j≦T. T denotes the maximum number of errors that the ECC is able to correct per code word. Unit 108 may apply any suitable method in order to compute the ELP for a given code word, such as, for example, the Berlekamp-Massey method, the Euclidean method or the Peterson Gorenstein Zierler method, cited above.

Unit 108 provides the ELP coefficients $a_1 \ldots a_j$ to an error location unit 112. Unit 112 determines the roots of the ELP, i.e., the elements x of $GF(2^m)$ for which $ELP(x)=0$, using techniques that are described in detail below. For a given code word, the ELP roots are indicative of the locations of the errors within the code word. ECC decoder 100 then corrects the errors at the identified locations. For a BCH code, the ELP roots identify the erroneous bits in the code word, and the decoder corrects the errors by reversing the values of the identified bits. In a RS code, on the other hand, the ELP roots indicate the erroneous symbols in the code words. In this case, decoder 100 determines the error values in addition to the error locations in order to correct the errors. The correction functionality can be carried out either by unit 112 or by other circuitry (not shown in the figure) in decoder 100.

Figure 4:
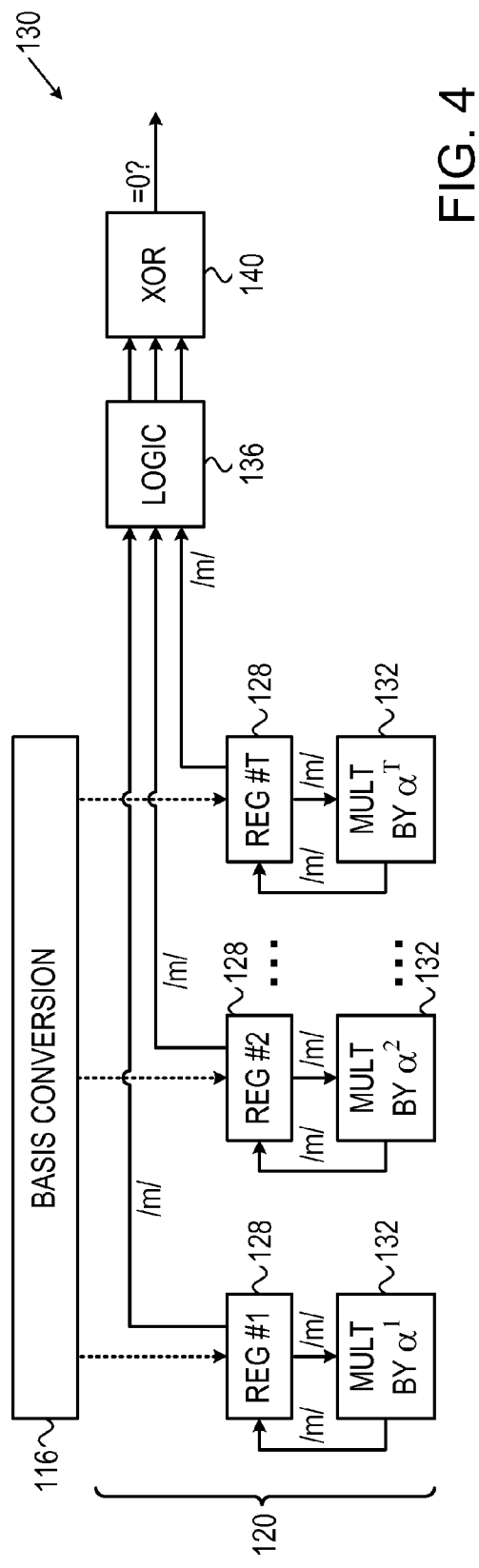
FIG. 4 is a block diagram that schematically illustrates an error location unit, in accordance with an embodiment of the present invention.
Figure 7:
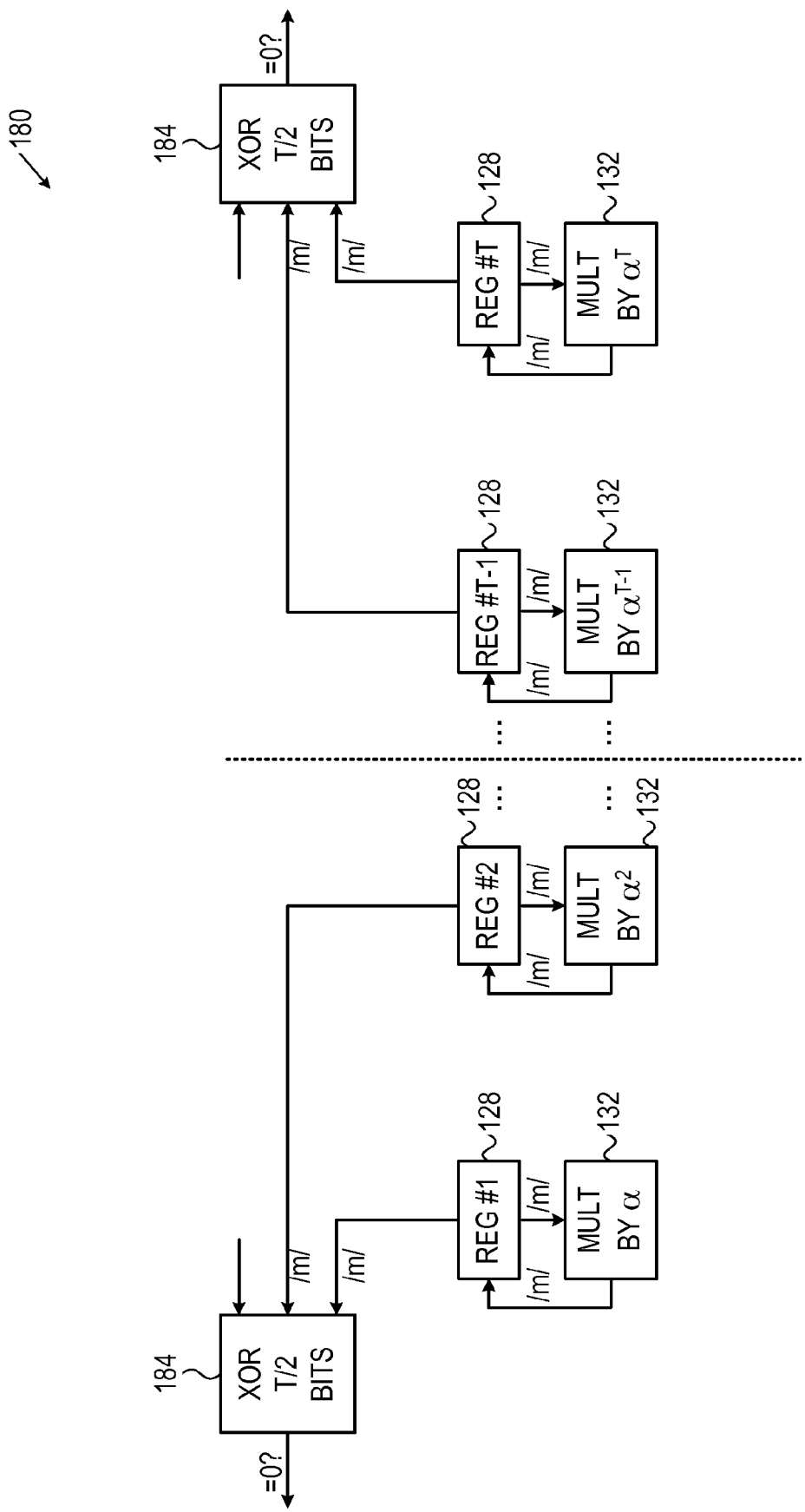
FIG. 7 is a block diagram that schematically illustrates an error location unit, in accordance with another embodiment of the present invention.

In some embodiments, unit 112 identifies the ELP roots by representing the ELP coefficients using different algebraic bases. In other words, unit 112 represents each ELP coefficient using a respective algebraic basis, such that at least two of the bases are different from one another. This representation reduces the hardware size (and therefore the area, cost and power consumption) of the decoder. Error location unit 112 comprises a basis conversion unit 116, which converts each ELP coefficient to its designated basis. A root search unit 120 operates on the ELP coefficients, after basis transformation, so as to identify the ELP roots. A control unit 124 manages the operation of unit 112. Example implementations of error location unit 112 are shown in FIGS. 4 and 7 below.

ECC decoder 48 of FIG. 1, ECC unit 84 of FIG. 2 and ECC decoder 100 of FIG. 3 may be implemented in software, in hardware or using a combination of hardware and software elements. In some embodiments, decoder 48, unit and/or decoder 100 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In some embodiments, decoder 48, unit 84 and/or decoder 100 (including units 104, 108, 112, 116, 120 and 124) are implemented in hardware, such as using one or more Application-Specific Integrated Circuits (ASICs), Field-Programmable gate Arrays (FPGAs) and/or discrete components. Some or all of the decoder functions may alternatively be implemented in software, or using a combination of software and hardware elements.

Identifying ELP Coefficients Using Multiple Basis Representation

FIG. 4 is a block diagram that schematically illustrates an error location unit 130, in accordance with an embodiment of the present invention. The configuration of FIG. 4 can be used to implement error location unit 112 of FIG. 3 above.

Unit 130 comprises T registers 128, denoted REG#1 . . . REG#T. (As noted above, T denotes the maximum rank of the ELP, which is also the maximum number of errors that the decoder is able to correct per code word.) Unit 130 further comprises T multipliers 132, each multiplier 132 associated with a respective register 128. The multiplier that is associated with REG#K multiplies the content of this register by $\alpha^K$, wherein $\alpha$ denotes the field-generating element of the Galois field over which the ECC is defined. The output of each multiplier is fed back to the respective register 128.

Upon receiving an input code word for decoding, unit 116 converts each ELP coefficient to a respective algebraic basis, as will be explained further below. Each register 128 is then initialized with a respective ELP coefficient that is represented using the appropriate algebraic basis. Then, unit 130 evaluates the ELP on the different elements of the Galois field, in an attempt to find one or more field elements x for which $ELP(x)=0$. In order to apply the ELP to the different field elements, multipliers 132 operate on the content of registers 128 in a series of cycles. In a given cycle, the multipliers multiply the current contents of REG#1 . . . REG#T by $\alpha^1 \ldots \alpha^T$, respectively. The multiplication result is fed back into the respective registers in preparation for the next cycle.

Unit 130 comprises logic 136, which re-converts the outputs of registers 128 to a common algebraic basis. The common basis may comprise the standard polynomial basis 1, $\alpha$, $\alpha^2 \ldots \alpha^{m-1}$, or any other suitable basis. An Exclusive OR (XOR) unit 140 calculates the XOR of the register outputs, after they have been transformed to the common basis. Thus, after the $i^{th}$ multiplication cycle, XOR unit 140 outputs the value of the ELP at the field element $\alpha^i$. If the output of unit 140 is zero at this stage, unit 130 concludes that $\alpha^i$ is a root of the ELP, and therefore corresponds to an error location in the input code word.

At a given point in time, each register REG#i holds a respective ELP term $r_i = a_i x^i$, which is represented using a respective basis. Let $A_i$ denote the transformation that transforms the present basis of $r_i$ to the common basis. The sum of all the vectors in this basis is the sum over $A_i r_i$. This expression can be represented as a matrix multiplication of a matrix by a vector in GF(2), in which each multiplication operation is represented by logical AND and each addition is represented by logical XOR. Each multiplication of the form $A_i r_i$ produces an m-element binary vector.

In some embodiments, logic 136 carries out the above-defined matrix multiplication and outputs the above-defined m-element binary vectors. XOR unit 140 applies bit-wise XOR to these vectors. If all elements of the bit-wise XOR are zero, then the currently-evaluated field element is an ELP root. In an alternative embodiment, unit 140 may calculate a logical AND of all the elements of the bit-wise XOR. The AND operation produces a single bit, which is "0" for an ELP root and "1" otherwise. The latter implementation shows that the logic that combines the registers in order to check whether x is an ELP root is basis independent. Any logic that implements this function is equivalent to the proposed implementation using the standard basis.

In some embodiments, logic 136 also accepts the constant term (free term) of the ELP as input (this input is not shown in the figure). When the ELP is written as $ELP(X)=1+a_1 x + a_2 x^2 + \ldots + a_j x^j$, without loss of generality, the constant term is unity. Typically, this constant term is also expressed using a certain algebraic basis and is provided as input to logic 136 and subsequently to XOR unit 140. In these embodiments, the output of XOR unit 140 is compared to zero in order to determine whether the currently-evaluated field element is an ELP root. In alternative embodiments, logic 136 accepts the outputs of registers 128 but not the constant term of the ELP. In these embodiments, the output of XOR unit 140 is compared to the value of the constant ELP term.

The task of multiplying the content of register REG#K by $\alpha^K$ can be represented as a set of vector operations that implement matrix multiplication. In this representation, the set of m powers of a certain field element $\beta$ form an algebraic basis that spans $GF(2^m)$. Thus, any element of the $GF(2^m)$ field can be represented as $$\sum_{i=0}^{m-1} d_i \beta^i,$$

wherein $d_i$ comprise binary bits, i.e., as an m-tuple of binary bits. Since the content of register REG#K is an element in field $GF(2^m)$, it can be represented as such an m-tuple. The task of multiplying a Galois field element by a constant can be represented as a linear operation on the coefficients of this field element. This multiplication task can therefore be carried out by a matrix multiplication in GF(2). Thus, the multiplication of REG#K by $\alpha^K$ can be represented by a multiplication of a matrix (representing $\alpha^K$) by a vector (the m-tuple representing the register content).

In some embodiments, basis conversion unit 116 converts each ELP coefficient (i.e., the initial content of each register 128) such that the corresponding matrix is sparse (i.e., contains a small number of non-zero elements). As a result, multipliers 132 can be implemented using small-size hardware that occupies a small die area and has low power consumption.

Let A denote the matrix representing $\alpha^K$, i.e., the multiplicand of the $K^{th}$ multiplier 132. An example technique for converting A into a sparse matrix is to represent A using an algebraic basis, which is produced by multiplying different powers of A by a vector y. (Vector y is commonly chosen as 1, but can alternatively be chosen to be any arbitrary field element.) In other words, the basis is given by $\{y, Ay, A^2y \ldots A^iy \ldots\}$. When expressing matrix A using such a basis, the matrix transforms to the sparse form:

$$\begin{pmatrix} 0 & 1 & 0 & \cdots & a_1 \\ 0 & 0 & 1 & & a_2 \\ 0 & 0 & 0 & \cdots & a_3 \\ \vdots & & & & \vdots \\ 0 & 0 & 0 & \cdots & a_n \end{pmatrix}$$

The transformed matrix has one column (or row) of non-zero elements, and one off-diagonal whose elements are equal to unity. All other matrix elements are zero.

Thus, in some embodiments, basis conversion unit 116 converts each ELP coefficient to the algebraic basis $\{y, Ay, A^2y \ldots A^iy \ldots\}$, wherein A denotes the matrix representing the multiplicand $\alpha^K$ by which the corresponding multiplier 132 multiplies this ELP coefficient. Unit 116 then loads the converted ELP coefficients into registers 128, and multipliers 132 operate of their register contents in order to identify the ELP roots.

By operating each register 128 and respective multiplier 132 using the above-described basis, the multiplication operation of the multiplier is equivalent to a multiplication of a sparse matrix by a vector. This operation can be implemented using a small number of logical operations. Moreover, since the off-diagonal elements of the matrix are equal to unity, multiplication by these elements is further simplified. Since each ELP coefficient corresponds to a different matrix A, different ELP coefficients are represented using different algebraic bases.

In alternative embodiments, unit 116 may convert the ELP coefficients into any other suitable algebraic bases, such that at least two coefficients are expressed using bases that differ from one another, and such that the resulting matrices are sparse.

In some embodiments, logic 136 converts the outputs of registers 128 to a common algebraic basis, so they can be XORed together. This extra logic is tolerable, since it does not affect the feedback path from the multipliers to the registers. Moreover, logic 136 can be optimized by sharing hardware among different coefficients, so as to reduce its size and power consumption.

The description above addressed the case in which matrices A are square, and that the vectors $\{y, Ay, A^2y \ldots A^iy \ldots\}$ span the entire vector space $GF(2^m)$. Nevertheless, the disclosed techniques are not limited to these cases, and can be generalized in a straightforward manner to matrices and to sets of vectors that do not fully span the vector space.

In the embodiment of FIG. 4, each register 128 is associated with a single respective multiplier. This configuration applies the ELP to a single field element in each cycle. In an alternative embodiment, the decoder may comprise multiple banks of multipliers, such that each register 128 is associated with two or more multipliers. In a given cycle, each bank of multipliers evaluates a different field element. This configuration enables the decoder to apply the ELP to two or more field elements in each cycle, and thus reduce the root identification time.

Figure 5:
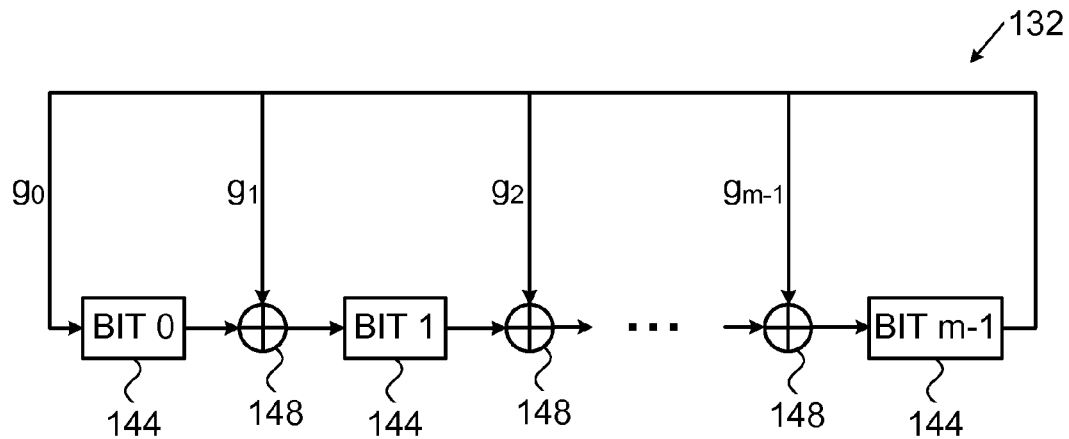
FIG. 5 is a block diagram that schematically illustrates a multiplier used in an error location unit, in accordance with an embodiment of the present invention.

FIG. 5 is a block diagram that schematically illustrates an example multiplier 132 used in error location unit 130, in accordance with an embodiment of the present invention. When using the above-described basis transformation, each multiplier 132 can be implemented using the small-size configuration of FIG. 5. The multiplier of FIG. 5 comprises a cascade of m bit registers 144 and m−1 XOR gates 148, with weighted feedback taps that are fed back to the XOR gates. After multiplication, the m values of registers 144 (m-bit word) are used as the multiplier output.

Weight coefficients $g_1 \ldots g_{m-1}$ denote binary coefficients, whose values depend on the specific basis that is used in that multiplier. In other words, coefficients $g_1 \ldots g_{m-1}$ depend on the field element that the specific multiplier 132 multiplies by. In alternative embodiments, however, any other suitable multiplier configuration can also be used.

Decoding Method Description

Figure 6:
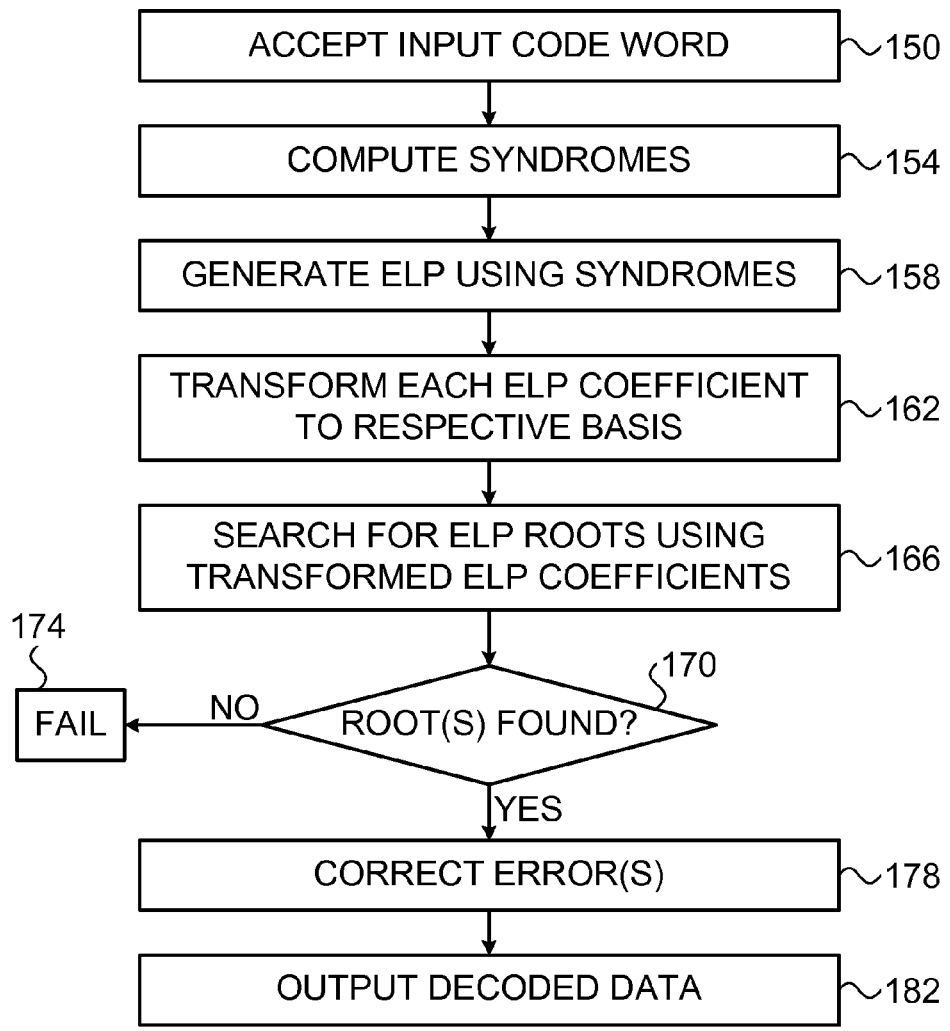
FIG. 6 is a flow chart that schematically illustrates a method for ECC decoding, in accordance with an embodiment of the present invention.

FIG. 6 is a flow chart that schematically illustrates a method for ECC decoding, in accordance with an embodiment of the present invention. The method begins with decoder 100 (FIG. 3) accepting an input code word for decoding, at an input step 150. Syndrome calculation unit 104 in decoder 100 computes syndromes for the input code word, at a syndrome computation step 154. ELP computation unit 108 computes an ELP comprising multiple coefficients based on the syndromes, at an ELP generation step 158. Unit 108 generates a set of ELP coefficients, and provides the ELP coefficients to error location unit 112.

In unit 112, basis conversion unit 116 converts each ELP coefficient to a respective algebraic basis, at a basis conversion step 162. The bases are selected so that at least two bases, corresponding to two ELP coefficients, are different from one another. In an example embodiment, unit 116 selects bases of the form $\{y, Ay, A^2y \ldots A^iy \ldots\}$. Root search unit 120 checks whether one or more Galois field elements are roots of the ELP, at a root searching step 166. In an example embodiment, unit 120 may search for ELP roots using the configuration of FIG. 4. Alternatively, any other suitable root searching configuration can also be used.

For example, some known root searching schemes evaluate more than one field element in each clock cycle. Such schemes are described, for example, by the Chen and Parhi article, cited above. In some embodiments, the root search unit in error location unit 112 evaluates d candidate field elements in each clock cycle, e.g., using one of the above-cited configurations. In these embodiments, the root search unit comprises d logic modules similar to logic 136, each logic module evaluating a respective candidate field element. The logic modules may share hardware with one another. In some embodiments, the multipliers associated with the $k^{th}$ register typically multiply by $\alpha^{ik}$, $1 \leq i \leq d$. The optimized basis for this register is typically determined by the feedback path multiplier $\alpha^{dk}$.

Control unit 124 checks whether one or more ELP roots were found, at a root checking step 170. Each identified root corresponds to an error in the code word, and indicates the bit or symbol in which the error occurred. If the number of roots found is less than the ELP rank, the control unit concludes that the code word has more than T errors. The decoding attempt thus fails, at a failure termination step 174. Otherwise, control unit 124 corrects the error or errors corresponding to the identified roots, at an error correction step 178. For a BCH code, unit 124 typically inverts the bit values at the locations in the code word that correspond to the identified ELP roots. For a RS code, unit 124 determines the correct values of the symbols whose locations in the code word are indicated by the identified ELP roots, and substitutes the erroneous symbol values with the correct values. After correcting the errors, unit 112 outputs the decoded data, at an output step 182.

Concurrent Evaluation of Multiple Field Elements Using a Single Bank of Registers and Multipliers The configuration of error location unit 130 in FIG. 4 above is capable of identifying up to T errors per code word. In many practical cases, however, a given code word comprises less than T errors, and often less than T/2 errors. In these cases, it is possible to apply the ELP to two or more field elements concurrently using a single bank of registers and a single bank of multipliers. In some embodiments, the root search unit has two predefined operational modes. In the first mode, a bank of registers and associated multipliers is used for evaluating the ELP on a single field element. In the second operational mode, the same bank of registers and multipliers is used for evaluating the ELP on two or more field elements concurrently, using techniques that are described below. Typically, the first mode is selected when the expected number of errors is high (e.g., >T/2), and the second mode is selected when the expected number of errors is low (e.g., <T/2). Alternatively, any other suitable selection criteria can also be used.

In some embodiments, when operating in the second mode, the bank of registers 128 and multipliers 132 is split into subsets, and each subset of multipliers is operated separately to test an ELP on a different field element. This technique enables to evaluate multiple field elements per cycle (and therefore reduce latency and power consumption), provided that the number of errors does not exceed the number of multipliers in the subset.

FIG. 7 is a block diagram that schematically illustrates an error location unit 180, in accordance with another embodiment of the present invention. In the present example, unit 180 comprises a single bank of registers and a single bank of multipliers, such that each multiplier is coupled to a respective register. Registers 128 and multipliers 132 are split into two subsets. The outputs of registers 128 in each subset are processed by a separate XOR unit 184. Thus, the two subsets evaluate the ELP concurrently on two respective field elements. (When using different basis representation for different ELP coefficients, each subset of registers and multipliers is also associated with separate logic 136—not shown in the figure.)

The example of FIG. 8 shows two subsets for the sake of clarity. Alternatively, the registers and multipliers can be split into any desired number of subsets. The subsets may be of the same size or of different sizes. FIG. 8 shows the bank of registers and multipliers operating in the second mode. When the same bank of registers and multipliers operates in the first mode (i.e., evaluate the ELP on a single field element), the registers and multipliers are coupled to a single XOR unit, such as in the configuration of FIG. 4 above.

When operating in the second mode (FIG. 8), the registers in each subset can be initialized in different ways, so as to scan the Galois field for ELP roots in different manners. In some embodiments, for a given ELP(x), the registers in one subset are initialized with the coefficients of ELP(x), and the registers in the other subset are initialized with the coefficients of ELP($\alpha^b$x). Using this configuration, the first subset evaluates field elements $\alpha^0, \alpha^1, \alpha^2 \ldots$, while the second subset evaluates field elements $\alpha^{b+0}, \alpha^{b+1}, \alpha^{b+2} \ldots$. Calculation of the coefficients of ELP($\alpha^b$x) can be performed, for example, by control unit 124.

In an example implementation, the first subset evaluates field elements $\alpha^0, \alpha^2, \alpha^4 \ldots$, while the second subset evaluates field elements $\alpha^1, \alpha^3, \alpha^5 \ldots$. In another embodiment, the first subset evaluates field elements $\alpha^0, \alpha^1, \alpha^2 \ldots$, while the second subset evaluates field elements $\alpha^r, \alpha^{r+1}, \alpha^{r+2} \ldots$. When each subset is capable of evaluating m field elements in parallel using multiple multiplier banks, the first subset may evaluate field elements $[\alpha^0, \alpha^1, \alpha^2, \ldots, \alpha^{m-1}]$ and $[\alpha^{2m}, \alpha^{2m+1}, \alpha^{2m+2}, \ldots, \alpha^{3m-1}]$, while the second subset evaluates field elements $[\alpha^m, \ldots, \alpha^{2m-1}]$ and $[\alpha^{3m}, \ldots, \alpha^{4m-1}]$.

In alternative embodiments, two or more field elements can be evaluated in a single cycle even without splitting the registers into separate subsets. In other words, the register and multiplier configuration is not changed when switching between the first and second operational modes. In an example embodiment of operating in the second mode, a new polynomial denoted ELP'(x) is defined as ELP'(x)=ELP(x)·ELP($\alpha^b$x). ELP'(x) is referred to as a product polynomial. The coefficients of ELP'(x) can be calculated, for example, by control unit 124. Registers 128 in unit 130 (FIG. 4) are then initialized with the coefficients of ELP'(x), and the root search process is performed as explained above. This process finds the roots of ELP'(x).

If a certain x is found to be a root of ELP'(x), then either x or $\alpha^b$x is a root of ELP(x). Thus, once a root of ELP'(x) is found, unit 130 checks whether x or $\alpha^b$x is a root of ELP(x). This additional checking step involved additional computations, but is performed only a small number of times. The additional checking step can be performed, for example, by control unit 124.

In a particular embodiment, b=1 in the definition of ELP'(x). In this embodiment, two consecutive field elements are evaluated in each cycle. Thus, in order to avoid superfluous computations, the multipliers are configured to multiply by even powers of $\alpha$, i.e., by $\alpha^2, \alpha^4, \ldots$. In an alternative embodiment, b is set to approximately half of the range of possible roots. In this embodiment, each cycle tests field elements that are not consecutive, and the multipliers need not be changed. Further alternatively, a given bank of registers and multipliers can be configured to test multiple field elements in each cycle using any other suitable scheme.

In the description above, ELP'(x) is defined as a product of two terms. In alternative embodiments, e.g., when the expected number of errors is small, ELP'(x) can be defined as a product of three or more terms, so as to test three or more field elements in parallel. For example, ELP'(x) can be defined as ELP'(x)=ELP(x)·ELP($\alpha^b$x)·ELP($\alpha^c$x) for some b≠c.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for decoding an Error Correction Code (ECC), the method comprising:
    accepting coefficients, including at least first and second coefficients, of an Error Locator Polynomial (ELP) that is defined over a vector space and has at least one root that is indicative of a location of an error in a set of bits, which represent data that has been encoded with the ECC;
    representing the first coefficient using a first basis of the vector space, and representing the second coefficient using a second basis of the vector space, different from the first basis;
    using processing circuitry, identifying the root of the ELP by applying algebraic operations to the coefficients, such that the algebraic operations are applied to the first coefficient using the first basis, and to the second coefficient using the second basis; and
    correcting the error responsively to the identified root of the ELP.

2. The method according to claim 1, wherein representing the coefficients comprises selecting the first and second bases such that the algebraic operations applied to the coefficients comprise sparse matrix multiplications.

3. The method according to claim 1, wherein the first basis comprises first vectors, each first vector comprising a respective power of a first matrix multiplied by a first vector, and wherein the second basis comprises second vectors, each second vector comprising a respective power of a second matrix multiplied by a second vector, such that the first matrix is different from the second matrix.

4. The method according to claim 3, wherein applying the algebraic operations to the coefficients comprises multiplying the first and second coefficients by first and second multiplicands, respectively, and wherein the first matrix depends on the first multiplicand and the second matrix depends on the second multiplicand.

5. The method according to claim 1, wherein identifying the root comprises converting results of the algebraic operations applied to the coefficients to a common algebraic basis, combining the results at the common algebraic basis, and determining the root responsively to the combined results.

6. The method according to claim 1, wherein applying the algebraic operations to the coefficients comprises multiplying the first and second coefficients by first and second multiplicands respectively using first and second multipliers, each including a cascade of bit registers with weighted feedback taps.

7. The method according to claim 1, and comprising receiving a communication signal that carries the data encoded with the ECC, extracting the bits from the signal, and calculating the coefficients based on the extracted bits.

8. The method according to claim 1, and comprising retrieving the data encoded with the ECC from a memory, and calculating the coefficients based on the retrieved bits.

9. A method for decoding an Error Correction Code (ECC), the method comprising:
    accepting coefficients of an Error Locator Polynomial (ELP), which is defined over a field and has at least one root that is indicative of a location of an error in a set of bits, which represent data that has been encoded with the ECC;
    selecting one of first and second predefined operational modes for identifying the root of the ELP, such that in the first operational mode the root is identified by evaluating the ELP on a single element of the field using a first bank of registers, each holding one of the coefficients, and a second bank of multipliers that are coupled respectively to the registers, and in the second operational mode the root is identified by evaluating the ELP on two or more elements of the field concurrently using the first bank of the registers and the second bank of the multipliers; and
    identifying the root of the ELP using the selected operational mode, and correcting the error responsively to the identified root.

10. The method according to claim 9, wherein, upon selecting the second operational mode, identifying the root comprises splitting the registers and the multipliers into two or more subsets, and evaluating the ELP on each of the two or more elements of the field using a respective subset of the registers and the multipliers.

11. The method according to claim 9, wherein, upon selecting the second operational mode, identifying the root comprises defining a product polynomial, which comprises the ELP applied to an operand, multiplied by the ELP applied to a multiple of the operand, and finding one or more roots of the product polynomial.

12. The method according to claim 9, and comprising receiving a communication signal that carries the data encoded with the ECC, extracting the bits from the signal, and calculating the coefficients based on the extracted bits.

13. The method according to claim 9, and comprising retrieving the data encoded with the ECC from a memory, and calculating the coefficients based on the retrieved bits.

14. Apparatus for decoding an Error Correction Code (ECC), the apparatus comprising:
    basis conversion circuitry, which is configured to accept coefficients, including at least first and second coefficients, of an Error Locator Polynomial (ELP) that is defined over a vector space and has at least one root that is indicative of a location of an error in a set of bits, which represent data that has been encoded with the ECC, to represent the first coefficient using a first basis of the vector space, and to represent the second coefficient using a second basis of the vector space, different from the first basis; and
    root search circuitry, which is configured to identify the root of the ELP by applying algebraic operations to the coefficients, such that the algebraic operations are applied to the first coefficient using the first basis and to the second coefficient using the second basis.

15. The apparatus according to claim 14, wherein the basis conversion circuitry is configured to select the first and second bases such that the algebraic operations applied to the coefficients comprise sparse matrix multiplications.

16. The apparatus according to claim 14, wherein the first basis comprises first vectors, each first vector comprising a respective power of a first matrix multiplied by a first vector, and wherein the second basis comprises second vectors, each second vector comprising a respective power of a second matrix multiplied by a second vector, such that the first matrix is different from the second matrix.

17. The apparatus according to claim 16, wherein the root search circuitry comprises first and second multipliers that are configured to multiply the first and second coefficients by first and second multiplicands, respectively, and wherein the first matrix depends on the first multiplicand and the second matrix depends on the second multiplicand.

18. The apparatus according to claim 14, wherein the root search circuitry is configured to convert results of the algebraic operations applied to the coefficients to a common algebraic basis, to combine the results at the common algebraic basis, and to determine the root responsively to the combined results.

19. The apparatus according to claim 14, wherein the root search circuitry comprises first and second multipliers that are configured to multiply the first and second coefficients by first and second multiplicands, respectively, each multiplier comprising a cascade of bit registers with weighted feedback taps.

20. The apparatus according to claim 14, and comprising a receiver, which is configured to receive a communication signal that carries the data encoded with the ECC, and to extract the bits from the signal.

21. The apparatus according to claim 14, and comprising readout circuitry, which is configured to retrieve the data encoded with the ECC from a memory.

22. Apparatus for decoding an Error Correction Code (ECC), the apparatus comprising:
Error Locator Polynomial (ELP) computation circuitry, which is configured to calculate coefficients of an ELP, which is defined over a field and has at least one root that is indicative of a location of an error in a set of bits, which represent data that has been encoded with the ECC; and
root search circuitry, which comprises a first bank of registers, each holding one of the coefficients, and a second bank of multipliers that are coupled respectively to the registers, and which is configured to select one of first and second predefined operational modes for identifying the root of the ELP, such that in the first operational mode the root is identified by evaluating the ELP on a single element of the field using the first bank of the registers and the second bank of the multipliers, and in the second operational mode the root is identified by evaluating the ELP on two or more elements of the field concurrently using the first bank of the registers and the second bank of the multipliers, and to identify the root of the ELP using the selected operational mode.

23. The apparatus according to claim 22, wherein, upon selecting the second operational mode, the root search circuitry is configured to split the registers and the multipliers into two or more subsets, and to evaluate the ELP on each of the two or more elements of the field using a respective subset of the registers and the multipliers.

24. The apparatus according to claim 22, wherein, upon selecting the second operational mode, the root search circuitry is configured to define a product polynomial, which comprises the ELP applied to an operand, multiplied by the ELP applied to a multiple of the operand, and to find one or more roots of the product polynomial.

25. The apparatus according to claim 22, and comprising a receiver, which is configured to receive a communication signal that carries the data encoded with the ECC, and to extract the bits from the signal.

26. The apparatus according to claim 22, and comprising readout circuitry, which is configured to retrieve the data encoded with the ECC from a memory.

* * * * *